United States Patent
Iyer

(10) Patent No.: US 9,628,926 B2
(45) Date of Patent: Apr. 18, 2017

(54) MODELING LOUDSPEAKERS BASED ON CASCADING LUMPED PARAMETER MODELS WITH NEURAL NETWORKS

(71) Applicant: HARMAN INTERNATIONAL INDUSTRIES, INC, Stamford, CT (US)

(72) Inventor: Ajay Iyer, Murray, UT (US)

(73) Assignee: HARMAN INTERNATIONAL INDUSTRIES, INC., Stamford, CA (US)

(*) Notice: Subject to any disclaimer, the term of this patent is extended or adjusted under 35 U.S.C. 154(b) by 11 days.

(21) Appl. No.: 14/702,382

(22) Filed: May 1, 2015

(65) Prior Publication Data
US 2016/0323685 A1    Nov. 3, 2016

(51) Int. Cl.
*H04R 29/00* (2006.01)
*H04R 3/00* (2006.01)
*H03G 11/00* (2006.01)

(52) U.S. Cl.
CPC .......... *H04R 29/001* (2013.01); *H03G 11/00* (2013.01); *H04R 3/007* (2013.01)

(58) Field of Classification Search
CPC .......... H04R 3/00; H04R 3/007; H04R 3/002; H04R 29/001; H04R 3/02; H04R 3/08; H04R 29/003; H04R 1/1041; A61F 11/06; G10L 5/06; G10L 9/00; G10L 15/063; G10L 15/16; H03H 21/0001; G10K 11/16; G10K 2210/117; G10K 2210/3039; H04B 17/103; H04B 17/11; H04B 17/14; H04B 17/19
USPC ........ 381/55, 56, 58, 59, 71.11, 71.7, 71.12, 381/96, 98, 104, 107, 108, 106; 330/379, 330/129, 278; 704/202, 232, 259, 704/E17.013, E15.017, E15.036; 455/569.2, 569.1, 575.2, 575.3, 575.4; 700/94
See application file for complete search history.

(56) References Cited

U.S. PATENT DOCUMENTS

2015/0304772 A1*  10/2015  Risberg .................. H04R 3/007
                                                                         381/55

OTHER PUBLICATIONS

Mingsian et al "Expert diagnostic system for moving-coil loudspeakers using nonlinear modeling", J. Acoustic Soc. Am. 125(2), pp. 819-830, Feb. 2009.*

* cited by examiner

*Primary Examiner* — Leshui Zhang
(74) *Attorney, Agent, or Firm* — Artegis Law Group, LLP

(57) ABSTRACT

In one embodiment of the present invention, a loudspeaker modeling subsystem configures a neural lumped parameter loudspeaker (NeLP) model to represent the behavior of a loudspeaker. The NeLP model is implemented as a cascaded combination of a lumped parameter model (LPM) and a neural network (NN) model. To configure the model, the loudspeaker modeling subsystem first estimates values for the parameters used in the LPM. The loudspeaker modeling subsystem then "fixes" these parameters and trains the NN model to act on a predicted output pressure that is generated via the LPM. More specifically, the loudspeaker modeling subsystem configures the NN to modify the predicted output pressure to minimize the error between the predicted output pressure and a measured loudspeaker output pressure. Notably, by strategically fusing the LPM and the NN model, the NeLP model leverages the strengths and mitigates the weaknesses typically associated with conventional loudspeaker modeling techniques.

21 Claims, 6 Drawing Sheets

MODELING LOUDSPEAKERS BASED ON CASCADING LUMPED PARAMETER MODELS WITH NEURAL NETWORKS

BACKGROUND

Field of the Invention

Embodiments of the present invention relate generally to loudspeaker systems and, more specifically, to modeling loudspeakers based on cascading lumped parameter models with neural networks.

Description of the Related Art

Modeling the behavior of one or more loudspeakers is a typical step when analyzing and/or designing an audio system. For example, a designer may perform several computer simulations of a loudspeaker based on a model of the loudspeaker to better understand the behavior and characteristics of the loudspeaker within the overall audio system being analyzed and/or designed.

One well-known type of model that is oftentimes employed when running such computer simulations is the lumped parameter model. In general, a lumped parameter model of a loudspeaker includes values of a set of parameters that, together, approximate the behavior of the loudspeaker. The parameters and the values of those parameters used in a lumped parameter model reflect simplifying assumptions, such as a piston-like motion of the loudspeaker diaphragm, that enable simplified mathematical modeling of the components within the loudspeaker and, consequently, more efficient simulation of the loudspeaker. However, the accuracy of a given lumped parameter model is reduced by the inaccuracies inherent in the simplifying assumptions made in the lumped parameter model as well as by any inaccuracies inherent in the values of the parameters used in the lumped parameter model.

While the tradeoff between efficiency and accuracy that is exhibited by a lumped parameter model is oftentimes understood and accepted, some aspects of actual loudspeaker behavior (e.g., breakup modes) are not adequately represented by a lumped parameter model and therefore need to be addressed by designers in some other way. Accordingly, designers tend to resort to simulating those aspects of loudspeaker behavior using computationally-intensive techniques, such as finite element analysis, boundary element analysis, or neural network techniques. While such techniques provide more accurate insight into the behavior of loudspeakers, the time required to simulate different aspects of loudspeaker behavior using such techniques can be prohibitive and therefore unsuitable for conventional design approaches.

As the foregoing illustrates, more effective techniques for modeling loudspeakers would be useful.

SUMMARY

One embodiment of the present invention sets forth a computer-implemented method for generating a model of a loudspeaker. The method includes generating via a lumped parameter model of the loudspeaker a first predicted output pressure based on a first audio input signal and a measured characteristic of the loudspeaker that corresponds to the first audio input signal; and training a neural network model to generate a second predicted output pressure based on the first predicted output pressure and a measured output pressure of the loudspeaker that corresponds to the first audio input signal, where a first difference between the second predicted output pressure and the measured output pressure is less than a second difference between the first predicted output pressure and the measured output pressure.

Further embodiments provide, among other things, a system and a non-transitory computer-readable medium configured to implement the method set forth above.

At least one advantage of the disclosed techniques is that that they enable both efficient and accurate simulation of the nonlinear aspects of loudspeaker systems. More specifically, a neural lumped parameter model of a loudspeaker accentuates the strengths while compensating for the weaknesses of both the lumped parameter model and neural networks to create a comprehensive, efficient, and accurate modeling paradigm.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details.

Loudspeaker Characterization System

Figure 1:
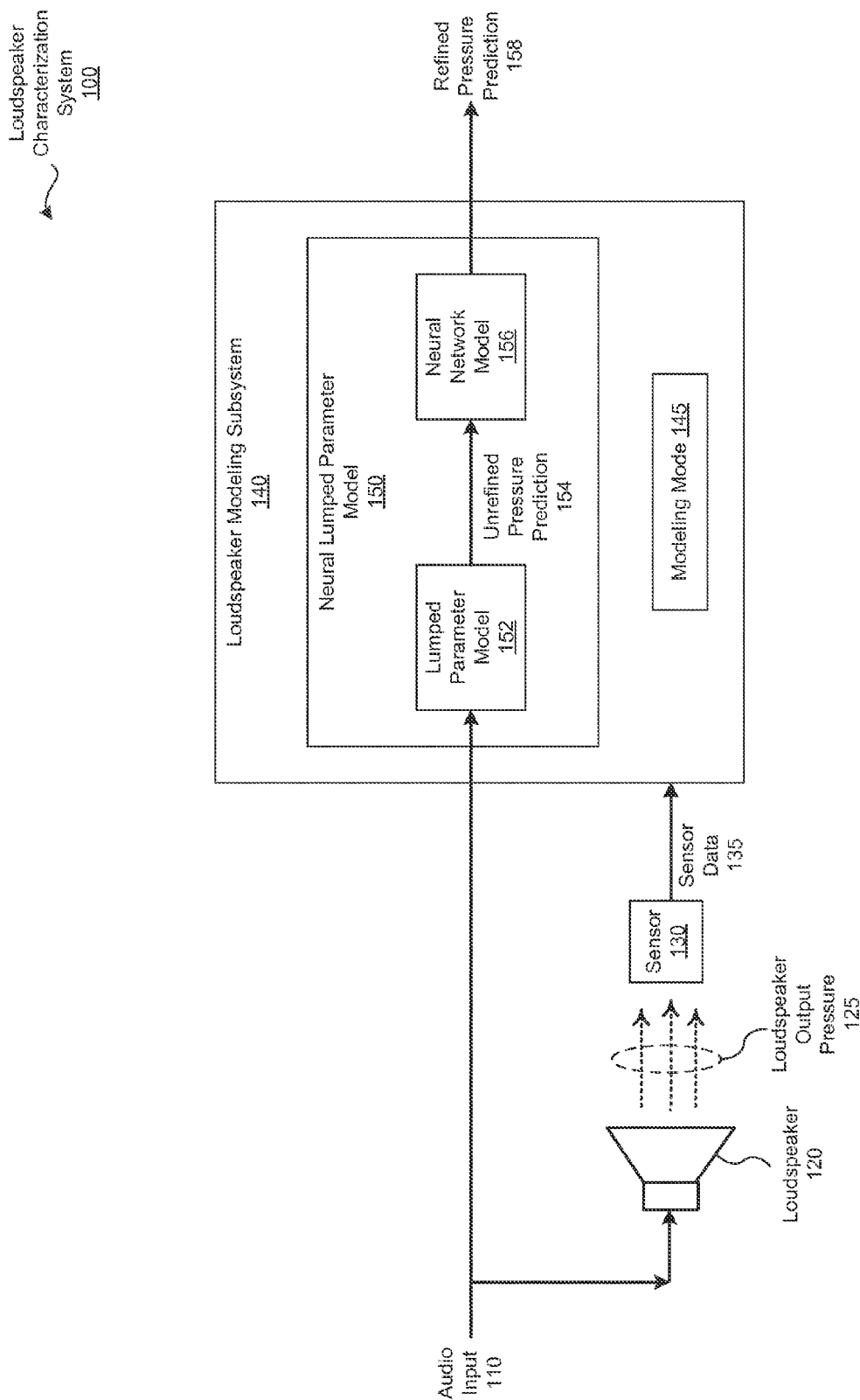
FIG. 1 illustrates a loudspeaker characterization system configured to implement one or more aspects of the various embodiments.

FIG. 1 illustrates a loudspeaker characterization system 100 configured to implement one or more aspects of the various embodiments. As shown, the loudspeaker characterization system 100 includes, without limitation, a loudspeaker 120, a sensor 130 and a loudspeaker modeling subsystem 140.

The loudspeaker 120 transforms an audio input 110 (i.e., an electrical audio signal) into a loudspeaker output pressure 125 to generate sound. The loudspeaker 120 may be implemented in any technically feasible fashion. For example, and without limitation, in some embodiments the loudspeaker 120 may be a "horn" loudspeaker. Alternatively, and without limitation, in some embodiments the loudspeaker 120 may be a "direct radiating" loudspeaker. In a complementary fashion, the sensor 130 transforms the loudspeaker output pressure 125 into sensor data 135, which is an electrical signal that "measures" one or more characteristics of the loudspeaker output pressure 125. For example, and without limitation, in some embodiments the sensor 130 may be a microphone and the sensor data 135 may be an electrical audio signal.

In alternate embodiments, the loudspeaker 120 and the sensor 130 may be replaced by any number of units that emulate the output of a hypothetical loudspeaker with at least an acceptable level of accuracy. For example, and without limitation, in alternate embodiments, the loudspeaker 120 and the sensor 130 may be omitted and the loudspeaker modeling subsystem 140 may be configured to perform computationally-intensive calculations, such as finite element analysis calculations, to fabricate "sensor data" that represents the response of a potential next-generation loudspeaker to the audio input 110. Subsequently, the loudspeaker modeling subsystem 140 may be configured to analyze the fabricated sensor data as part of creating a simplified model (compared to a finite element analysis model) of the loudspeaker 120 that meets both accuracy and efficiency requirements.

As the sensor 130 measures the performance of the loudspeaker 120 in response to the audio input 110, the sensor 130 relays sensor data 135 to the loudspeaker modeling subsystem 140. In general, the loudspeaker modeling subsystem 140 is configured to analyze and characterize the performance of the loudspeaker 120 based on the audio input 110 and the sensor data 135.

As used herein, "characterizing a model of a loudspeaker" refers to the process of configuring the model (e.g., setting values of parameters used in the model, training the model, etc.) to mimic the behavior of a selected loudspeaker. Corresponding, after a model is characterized, the model of a loudspeaker may be referred to herein as a "characterized model of a loudspeaker" and the output of the characterized model of a given loudspeaker reflects the behavior of the loudspeaker per the values of the parameters used in the model. Typically, designers use characterized model of a loudspeakers to gain insights into the behavior of loudspeakers in response to a variety of stimuli and/or under various conditions. For example, and without limitation, a designer may use a characterized model of a loudspeaker to emulate a loudspeaker as part of simulating a larger audio system. Alternatively, and without limitation, a designer may simulate a characterized model of a loudspeaker in an attempt to "tweak" the design of the loudspeaker to optimize specific aspects of the loudspeaker behavior.

The accuracy of a characterized model of a loudspeaker is typically constrained by the amount of time available to characterize the model as well as the amount of time available to simulate the model. For example, and without limitation, to facilitate relatively quick characterization and simulation, a lumped parameter model (LPM) that includes simplifying assumptions may be characterized and deployed for simulation purposes. If greater accuracy is required, then a relatively complex artificial neural network (NN) may be "trained" to emulate the loudspeaker.

While the tradeoffs provided by such conventional models are acceptable for some purposes, the associated accuracy and/or efficiency sacrifices may limit the use of the models for other purposes. Notably, the time required to simulate relatively complicated aspects of loudspeaker behavior (e.g., aspects that are not adequately represented by the LPM) using numerically-intensive techniques, such as complex NNs, may be prohibitive and, therefore, unsuitable for desired design approaches. For example, and without limitation, neither the LPM nor NN modeling techniques are amenable to an iterative design process that executes numerous simulations as part of optimizing a loudspeaker based on the complex effect of the breakup modes of the loudspeaker on the pressure at a point in space. Further, neither the LPM nor NN modeling techniques facilitate adapting the characterized model of a loudspeaker in a real-time fashion to reflect changes in the loudspeaker behavior that are attributable to long term effects such as thermal variations, suspension aging, and the like.

To address the forgoing concerns, the loudspeaker modeling subsystem 140 includes, without limitation, a neural lumped parameter (NeLP) model 150 that is designed to leverage the strengths while ameliorating the weaknesses of both LPMs and neural networks. As shown, the NeLP model 150 includes, without limitation, a lumped parameter model (LPM) 152 and a neural network (NN) model 156. The LPM 152 models portions of the loudspeaker behavior and the NN model 156 models the "residual nonlinear system" (i.e., portions of the loudspeaker behavior that the LPM 152 has incompletely and/or inaccurately modeled).

When executed outside the loudspeaker modeling subsystem 140 after characterization, the NeLP model 150 receives the audio input 110 and the LPM 152 generates an unrefined pressure prediction 154 that represents an estimate of the loudspeaker output pressure 125 in response to the audio input 110. The unrefined pressure prediction 154 cascades into the NN model 156 and, in response, the NN model 156 generates a refined pressure prediction 158, which is a more accurate estimate of the loudspeaker output pressure 125 in response to the audio input 110.

To efficiently and accurately characterize the NeLP model 150, the loudspeaker modeling subsystem 140 includes, without limitation, a modeling mode 145 that orchestrates the characterization of the LPM 152 and the NN model 156. More specifically, the loudspeaker modeling subsystem 140 sequentially sets the modeling mode 145 to reflect one of three modeling modes: an "estimating LPM parameters" mode, an "estimating NN parameters" mode, and a "fine tuning" mode.

During the estimating LPM parameters mode, the loudspeaker modeling subsystem 140 characterizes the LPM 152 (i.e., determines values of the parameters used in the LPM 152) based on the loudspeaker output pressure 125, independently of the NN model 156. More specifically the loudspeaker modeling subsystem 140 short-circuits the NeLP model 150, neither characterizing the NN model 156 nor causing the NN model 156 to generate the refined pressure prediction 158. After characterizing the LPM 152, the loudspeaker modeling subsystem 140 "fixes" the parameters used in the LPM 152 to the characterized values and restores the routing of the NeLP model 150 by configuring the output of the LPM 152 (the unrefined pressure prediction 152) as an input to the NN model 156. The loudspeaker modeling subsystem 140 then sets the modeling mode 145 to "estimating NN parameters."

During the estimating NN parameters mode, the loudspeaker modeling subsystem 140 trains the NN model 156 to reduce the error between the unrefined pressure prediction 152 and the loudspeaker output pressure 125. Notably, this error is symptomatic of highly nonlinear aspects of the loudspeaker 120 (e.g., breakup modes, air path distortion, compression chamber and phasing plug distortion, port nonlinearities, hysteresis, etc.) as well as residual errors in the characterized values of the parameters used in the LPM 152. Consequently, the NN model 156 learns to model only a portion of the behavior of the loudspeaker 120 (i.e., the portion that is not adequately modeled by the LPM 152) and the complexity of the NN model 156 is drastically reduced compared to a conventional NN that models a much great portion of the behavior of the loudspeaker 120. Accordingly, both the time required to characterize the NN model 156 and the time required to simulate the characterized NN model 156 is optimized without compromising the accuracy of the refined pressure prediction 154.

Subsequently, the loudspeaker modeling subsystem 140 sets the modeling mode 145 to the final mode, the fine tuning mode. In the fine tuning mode, the loudspeaker modeling subsystem 140 adjusts the characterized LPM 152 and/or the characterized NN model 156 based on the error between the refined pressure prediction 156 and the loudspeaker output pressure 125. Notably, the trained NN model 156 is defined by the values of a set of neural net parameters and, consequently, during the fine tuning mode, the loudspeaker modeling subsystem 140 adjusts both the values of the parameters used in the LPM 152 and the values of the parameters used in the NN model 156.

The loudspeaker modeling subsystem 140 is executed by a computing device and may be stored in any type of memory that may or may not be integrated with the computing device. For example, and without limitation, in some embodiments, the loudspeaker modeling subsystem 140 is stored in a universal serial bus (USB) flash drive that is connected to a USB port of a computing device.

Subsequently, any number of computing devices may execute any number and type of applications that use the NeLP model 150 of the loudspeaker 120. For example, the NeLP model 150 may be provided to any number of users that "import" the NeLP model 150 into various computing environments to facilitate analysis of and/or interactions with the loudspeaker 120.

In yet other embodiments, without limitation, any computing device may be configured to execute the fine tuning modeling phase in real-time. In some such embodiments, without limitation, a computing device associated with the loudspeaker 120, such as a loudspeaker controller, executes the loudspeaker characterization system 100 in the fine tuning mode. As the loudspeaker 120 operates, the loudspeaker characterization system 120 modifies the values of the parameters used in the LPM 152 and/or the values of the parameters used in the NN model 156 to reflect changes in the behavior of the loudspeaker 120. By contrast, after operating for a relatively long period of time, cumulative changes due to effects such as thermal variations, suspension aging, and the like, may reduce the accuracy of conventional loudspeaker models that do not facilitate real-time modifications of the characterized loudspeaker model.

Figure 2:
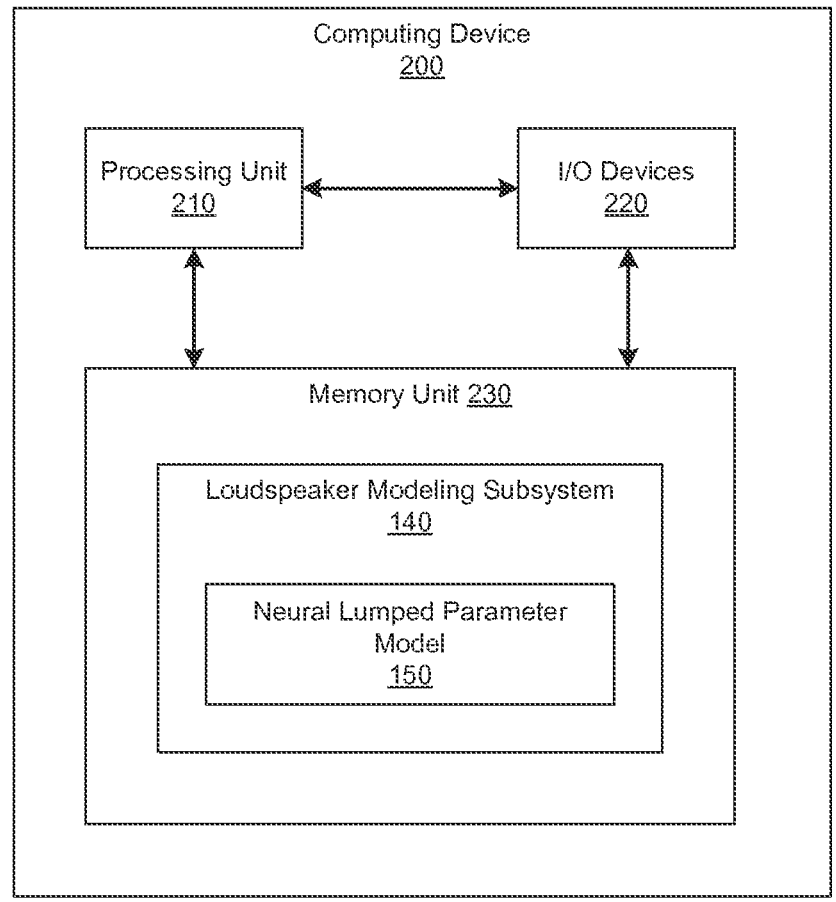
FIG. 2 illustrates a computing device in which one or more aspects of the loudspeaker modeling subsystem of FIG. 1 may be implemented, according to various embodiments.

FIG. 2 illustrates a computing device in which one or more aspects of the loudspeaker modeling subsystem 140 of FIG. 1 may be implemented, according to various embodiments. The computing device 200 may be any type of device capable of executing application programs. For instance, and without limitation, the computing device 200 may be a processing unit, a laptop, a tablet, a smartphone, etc. Among other things, and without limitation, the computing device 200 executes the loudspeaker modeling subsystem 140. As shown, the computing device 200 includes, without limitation, a processing unit 210, input/output (I/O) devices 220, and a memory unit 230. The memory unit 230 includes, without limitation, the loudspeaker modeling subsystem 140 and the neural lumped parameter model 150 (included in the loudspeaker modeling subsystem 140).

The processing unit 210 may be implemented as a central processing unit (CPU), digital signal processing unit (DSP), graphics processor unit (GPU), and so forth. The I/O devices 220 may include input devices, output devices, and devices capable of both receiving input and providing output. The memory unit 230 may include a memory module or collection of memory modules. As shown, the loudspeaker modeling subsystem 140 is included in the memory unit 230 and may be executed by the processing unit 210.

The computing device 200 may be implemented as a stand-alone chip, such as a microprocessor, or as part of a more comprehensive solution that is implemented as an application-specific integrated circuit (ASIC), a system-on-a-chip (SoC), and so forth. Generally, the computing device 200 may be configured to coordinate the overall operation of a computer-based system, such as a loudspeaker computer-aided development system. In other embodiments, the computing device 200 may be coupled to, but separate from the computer-based system. In such embodiments, the computer-based system may include a separate processor that transmits data (e.g., the audio input 110, the sensor data 135, etc.) to the computing device 200, which may be included in a consumer electronic device, such as a personal computer, and the like. However, the embodiments disclosed herein contemplate any technically feasible system configured to implement the functionality of the loudspeaker modeling subsystem 140 and/or apply the NeLP model 150 of the loudspeaker 120 in any combination.

Characterizing the Neural Lumped Parameter Model

Figure 3:
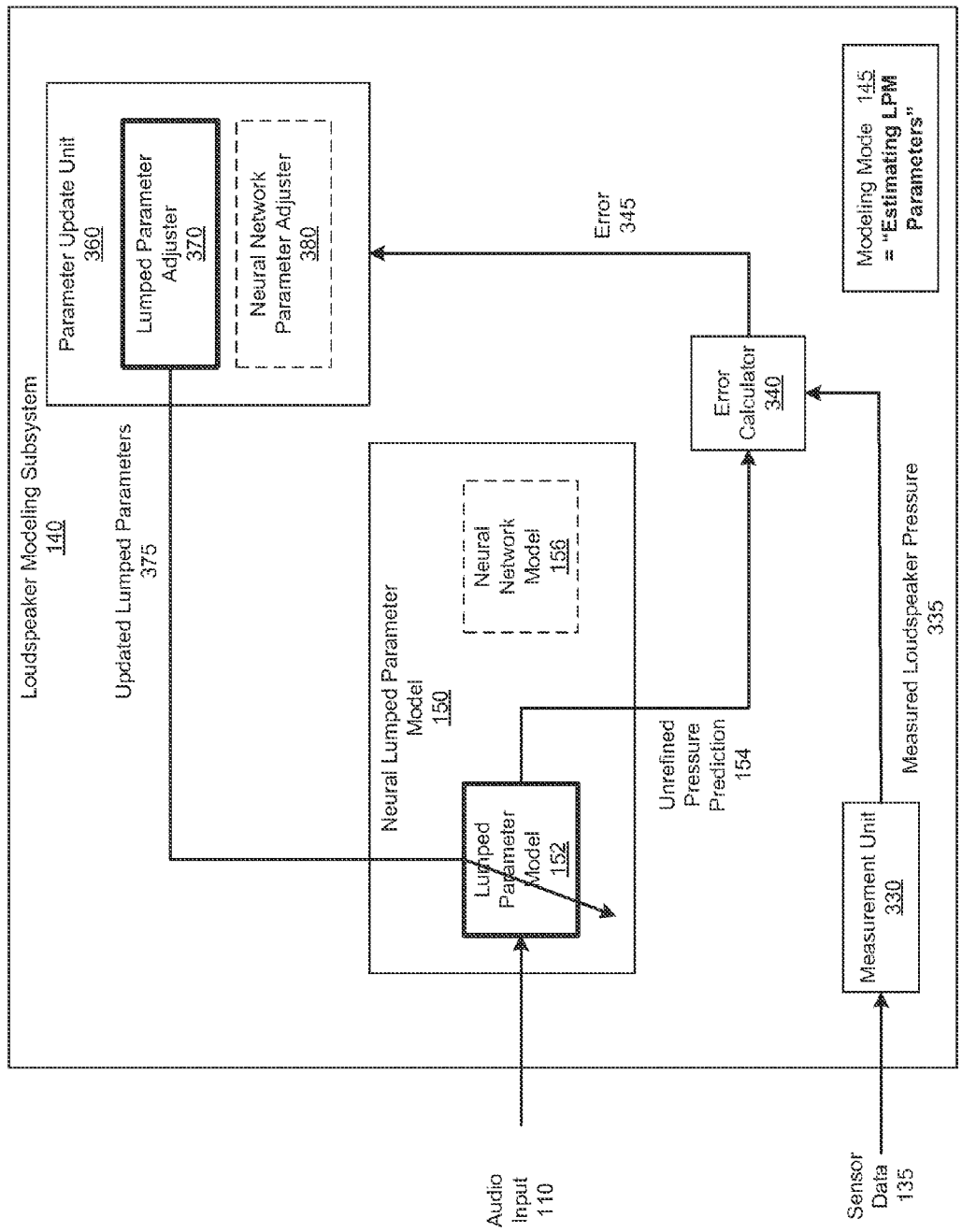
FIG. 3 is a more detailed illustration of the loudspeaker modeling subsystem of FIG. 1 showing the characterization of the lumped parameter model (LPM), according to various embodiments.

FIG. 3 is a more detailed illustration of the loudspeaker modeling subsystem 140 of FIG. 1 showing the characterization of the lumped parameter model (LPM), according to various embodiments. As shown, the loudspeaker modeling subsystem 140 includes, without limitation, the modeling mode 145, the neural lumped parameter (NeLP) model 150, a measurement unit 330, an error calculator 340, and a parameter update unit 360.

While characterizing the LPM 152 of the loudspeaker 120, the value of the modeling mode 145 is "estimating LPM parameters." Although the composite neural lumped parameter (NeLP) model 150, includes, without limitation, the LPM 152 and the neural network (NN) 156, in the estimating LPM parameters mode, the loudspeaker modeling subsystem 140 bypasses the neural network (NN) 156. Accordingly, the NN model 156 is depicted inside a dotted box to indicate that the NN model 156 is inactive while the loudspeaker modeling subsystem 140 operates in the estimating LPM parameters mode.

In general, the loudspeaker modeling subsystem 140 is configured to optimally exploit the efficiency that the LPM 152 exhibits when modeling the underlying causes of non-linearities related to, without limitation, voice coil current, cone displacement, and output pressure nonlinearities. For example, and without limitation, in some embodiments the loudspeaker modeling subsystem 140 may configure the LPM 152 to model force factor, stiffness, inductance, and flux modulation. In alternate embodiments, the loudspeaker modeling subsystem 140 may configure the LPM 152 to model any subset of loudspeaker behavior that is consistent with leveraging the strengths of the LPM 152.

As shown, the initial inputs to the LPM 152 include, without limitation, the audio input 110. The audio input 110 may be selected in any technically feasible fashion that, ideally, spans the expected operation range for the loudspeaker 120 and excites one or more loudspeaker aspects-of-interest. For example, in one implementation, the audio input 110 may include, without limitation, sweeps, multi-tones (more than two tones), square waves, noise and/or music in any combination. More specifically, in such an embodiment, the audio input 110 may be selected based on an iterative stimulus design process designed to optimize the stimulus for transducer parameter estimation.

In response to receiving the audio input 110, the LPM 152 generates the unrefined pressure prediction 154 based on the current values of the parameters used in the LPM 152. The LPM 152 may be defined in any technically feasible fashion and may include any number and type of parameters that are consistent with the definition of the LPM 152. For example, in one embodiment, without limitation, the LPM 152 may implement a set of equations, and the parameters used in the LPM 152 may include, without limitation: coefficients of force factor Bl(x), stiffness $K_{ms}(x)$, and voice coil inductance $L_e(x)$ polynomials, cone surface area $S_d$, mechanical resistance $R_{ms}$, voice coil DC resistance $R_e$, total moving mass $M_{ms}$, para-inductance $L_2(x)$, para-resistance $R_2(x)$, and flux modulation $L_e$. One example, without limitation, of a set of such equations are:

1) $G_i(t) = lR_{vc} + \dfrac{d(iL_2(x, t))}{dt} + \dfrac{d(i_2 L_2(x, t))}{dt} + Bl(x)v$ 2) $Bl(x)i = vR_{ms} + K_{tot}(x)x + M_{tot}\dfrac{dv}{dt} + F_m(x, i, i_2)$ 3) $F_m(x, i, i_2) = -\dfrac{i^2}{2}\dfrac{\partial(L_2(x, i))}{\partial x} - \dfrac{i_2^2}{2}\dfrac{\partial(L_2(x, i))}{\partial x}$ 4) $p(\tau) = \dfrac{d^2(x(t))}{dt^2}$ The loudspeaker modeling subsystem 140 may estimate values for the parameters used in the LPM 152 in any technically feasible fashion. For example, and without limitation, the loudspeaker modeling subsystem 140 may estimate values for the parameters used in the LPM 152 using an adaptive nonlinear least squares algorithm, such as Gauss-Newton, Newton's method, etc. In operation, as the LPM 152 receives the audio input 110 and generates the unrefined pressure prediction 154 based on the current values of the parameters used in the LPM 152, the measurement unit 330 processes the sensor data 135 that reflects the response of the loudspeaker 120 to the audio input 110. The measurement unit 330 extracts the measured loudspeaker pressure 335 from the sensor data 135 in any technically feasible fashion. In various embodiments, the functionality of the measurement unit 330 may be subsumed into other units or omitted. For example, in alternate embodiments, without limitation, the sensor data 135 may equal the measured loudspeaker pressure 335, and the measurement unit 330 may be omitted.

As shown, the error calculator 340 receives the unrefined pressure prediction 154 and the measured loudspeaker pressure 335 and then generates an error 345. The error calculator 340 may be implemented in any technically feasible fashion that is consistent with the implemented parameter estimation algorithm. For example, and without limitation, the error calculator 340 may be a subtraction operation that calculates the error 345 as the difference between the unrefined pressure 154 and the measured loudspeaker pressure 335.

The parameter update unit 360 receives the error 345 and is configured to calculate updated lumped parameters 375 that, when adopted by the LPM 152, reduce the error 345 of the unrefined pressure prediction 154 for the audio input 110. Although the parameter update unit 360 includes, without limitation, a lumped parameter adjuster 370 and a neural network parameter adjuster 380, in the estimating LPM parameters mode, the loudspeaker modeling subsystem 140 bypasses the neural network (NN) 156. Accordingly, the neural network parameter adjuster 380 is depicted inside a dotted box to indicate that the neural network parameter adjuster 380 is inactive while the loudspeaker modeling subsystem 140 operates in the estimating LPM parameters mode.

The lumped parameters adjuster 370 may generate the updated lumped parameters 375 in any manner that is consistent with the interactive parameter estimation algorithm implemented by the loudspeaker modeling subsystem 140. In alternate embodiments, the lumped parameter adjuster 370 may be integrated with the LPM 152. The loudspeaker modeling subsystem 140 feeds back the updated lumped parameters 375 to the LPM 152, the LPM 152 adopts the updated lumped parameters 375, and the LPM 152 continues to process the audio input 110. In this fashion, the loudspeaker modeling subsystem 140 iteratively adjusts the values of the parameters used in the LPM 152 to reduce the error between the unrefined pressure prediction 154 and the measured loudspeaker pressure 335.

In alternate embodiments, the loudspeaker modeling subsystem 140 is configured to characterize the LPM 152 based on a criterion other than minimizing errors between the unrefined pressure prediction 154 and the measured loudspeaker pressure 335. For example and without limitation, in alternate embodiments, the loudspeaker modeling subsystem 140 may be configured to characterize the LPM 152 based a voice coil current, a cone displacement, or an output pressure. In such embodiments, the sensor data 135, the measurement unit 330, the error calculator 340, the lumped parameter adjuster 370, and the LPM 152 are modified accordingly.

After characterizing the LPM 152 independently of the NN model 156, the loudspeaker modeling subsystem 140 "fixes" the parameters used in the LPM 152 to the characterized values. The output of the LPM 152, the unrefined pressure prediction 154, represents an estimate of the loudspeaker output pressure 125 in response to the audio input 110 based on the values of the parameters used in the LPM 152. Consequently, the accuracy of the unrefined pressure prediction 154 reflects both the simplifying assumptions inherent in the LPM 152 and the amount of time used to characterize the LPM 152. More specifically, the accuracy of the characterized LPM 152 correlates to the quality and quantity of the audio input 110 applied during the estimating LPM parameter phase.

Limitations of the LPM 152, such as the simplifying assumptions and the accuracy of the values of the parameters used in the LPM 152, are mitigated by the NN model 156. Notably, in the next modeling phase (estimating NN parameters), the NN model 156 is trained to generate the refined pressure prediction 158 based on minimizing the difference between the unrefined pressure prediction 154 and the loudspeaker output pressure.

Figure 4:
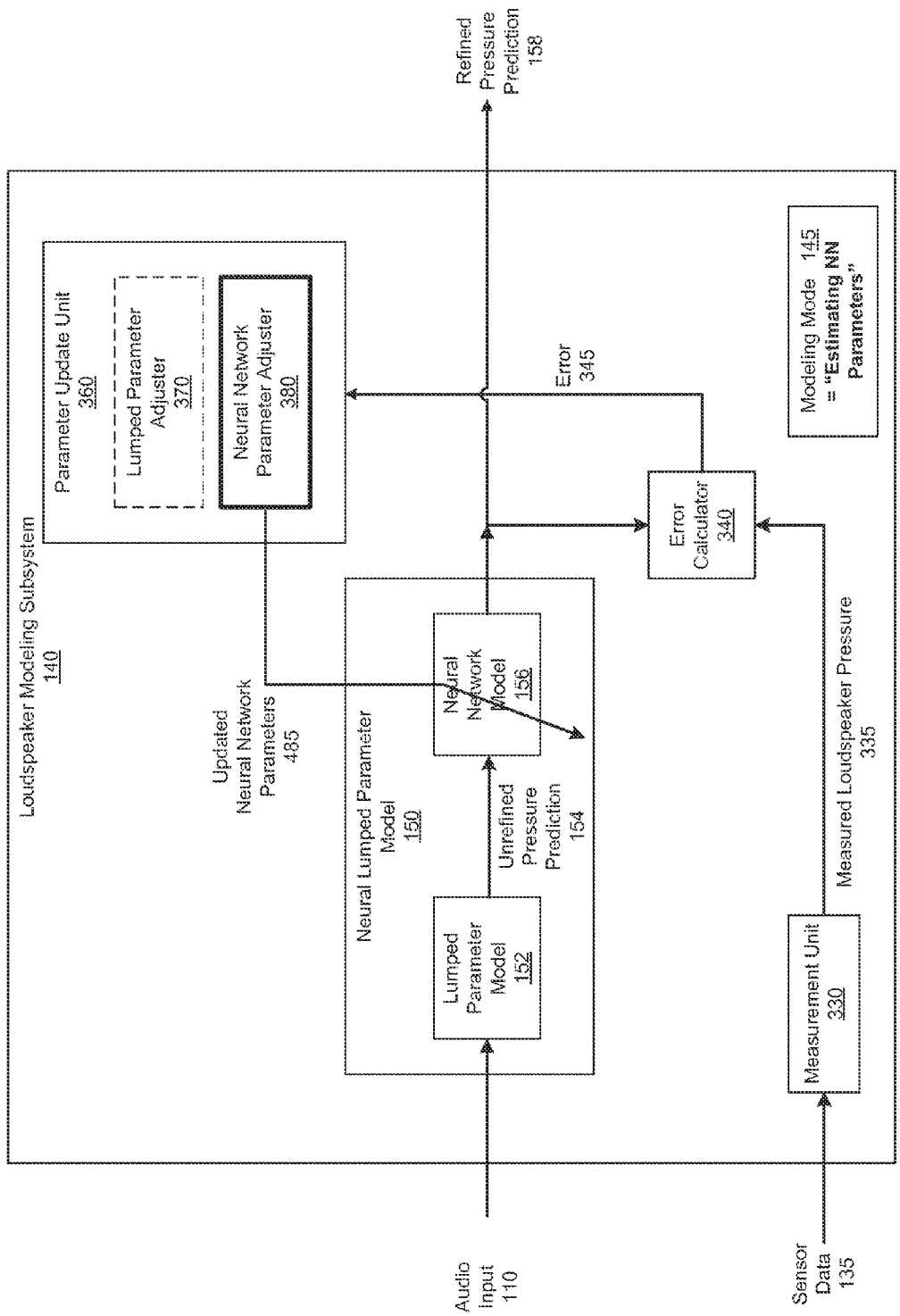
FIG. 4 is a more detailed illustration of the loudspeaker modeling subsystem of FIG. 1 showing the characterization of the neural network (NN) model, according to various embodiments.

FIG. 4 is more detailed illustration of the loudspeaker modeling subsystem 140 of FIG. 1 showing the characterization of the neural network (NN) model 156, according to various embodiments. As shown, the loudspeaker modeling subsystem 140 includes, without limitation, the modeling mode 145, the neural lumped parameter (NeLP) model 150, the measurement unit 330, the error calculator 340, and the parameter update unit 360.

While characterizing the neural network (NN) 156, the value of the modeling mode 145 is "estimating NN parameters," and the loudspeaker modeling subsystem 140 holds the parameters used in the LPM 152 to the values determined in the preceding "estimating LPN parameters" mode. In general, the loudspeaker modeling subsystem 140 is configured to train the NN model 156 to model the underlying causes of highly nonlinear aspects of the loudspeaker 120, such as breakup modes, as well as residual errors in the characterized values of the parameters used in the LPM 152. The NN model 156 uses a variety of numerical parameters that are tuned via a learning algorithm. The NN model 156 may be implemented in any technically feasible fashion using any architecture as known in the art. For example, and without limitation, the NN model 156 may implement one or more of a recurrent neural network (also known as a Elman neural network) architecture, a MutliLayer Perceptrons (MLP) architecture, a cascade correlation neural network, a recurrent cascade neural network, and a recurrent neural network.

As shown, the initial inputs to the NN model 156 include, without limitation, the unrefined pressure prediction 154. In response to receiving the unrefined pressure prediction, the NN model 156 generates the refined pressure prediction 158 based on the current values of the parameters used in the NN model 156. Notably, the parameters used in the NN model 156 differ from the parameters used in the LPM 152 and are defined by the architecture selected for the NN model 156 and the design of the NN model 156.

In operation, as the NN model 156 computes the refined pressure prediction 158, the measurement unit 330 processes the sensor data 135 that reflects the response of the loudspeaker 120 to the audio input 110, extracting the measured loudspeaker pressure 335. The error calculator 340 receives the refined pressure prediction 156 and the measured loudspeaker pressure 335 and then generates the error 345, which is the difference between the refined pressure prediction 158 and the measured loudspeaker pressure 335.

The parameter update unit 360 receives the error 345 and is configured to calculate updated neural network parameters 485 that, when adopted by the NN model 156, reduce the error 345 of the refined pressure prediction 156 for the audio input 110. Although the parameter update unit 360 includes, without limitation, the lumped parameter adjuster 370 and the neural network parameter adjuster 380, in the estimating NN parameters mode, the loudspeaker modeling subsystem 140 does not alter the values of the parameters used in the LPM 152. Accordingly, the lumped parameter adjuster 370 is depicted inside a dotted box to indicate that the lumped parameter adjuster 370 is inactive while the loudspeaker modeling subsystem 140 operates in the estimating NN parameters mode.

The neural network parameter adjuster 380 may generate the updated neural network parameters 485 in any manner that is consistent with the neural network architecture implemented by the NN model 156. For example, and without limitation, the neural network parameters adjuster 380 may minimize a least squares error cost function.

The loudspeaker modeling subsystem 140 then feeds back the updated neural network parameters 485 to the NN model 156, and the NN model 156 adopts the updated neural network parameters 485 and continues to operate on the unrefined pressure prediction 154. In alternate embodiments, the neural network parameter adjuster 380 may be integrated with the NN model 156. In this fashion, the loudspeaker modeling subsystem 140 iteratively adjusts the values of the parameters used in the NN model 156 (i.e., "trains" the NN model 156) to reduce the error between the refined pressure prediction 156 and the measured loudspeaker pressure 335.

In alternate embodiments, the loudspeaker modeling subsystem 140 may perform one or more operations on the unrefined pressured prediction 154 (a raw time-domain signal) to change the dimensionality of the input to the NN model 156 and, thereby, decrease the complexity and/or increase the accuracy of the NN model 156. As is well-known, reducing the dimensionality is the process of reducing the number of random variables under consideration. As part of the feature extraction, the loudspeaker modeling subsystem 140 may perform, without limitation, any number of short time Fourier transforms, cepstral transforms, wavelet transforms, Hilbert transforms, linear/nonlinear principal component analyses, and distortion analyses.

Figure 5:
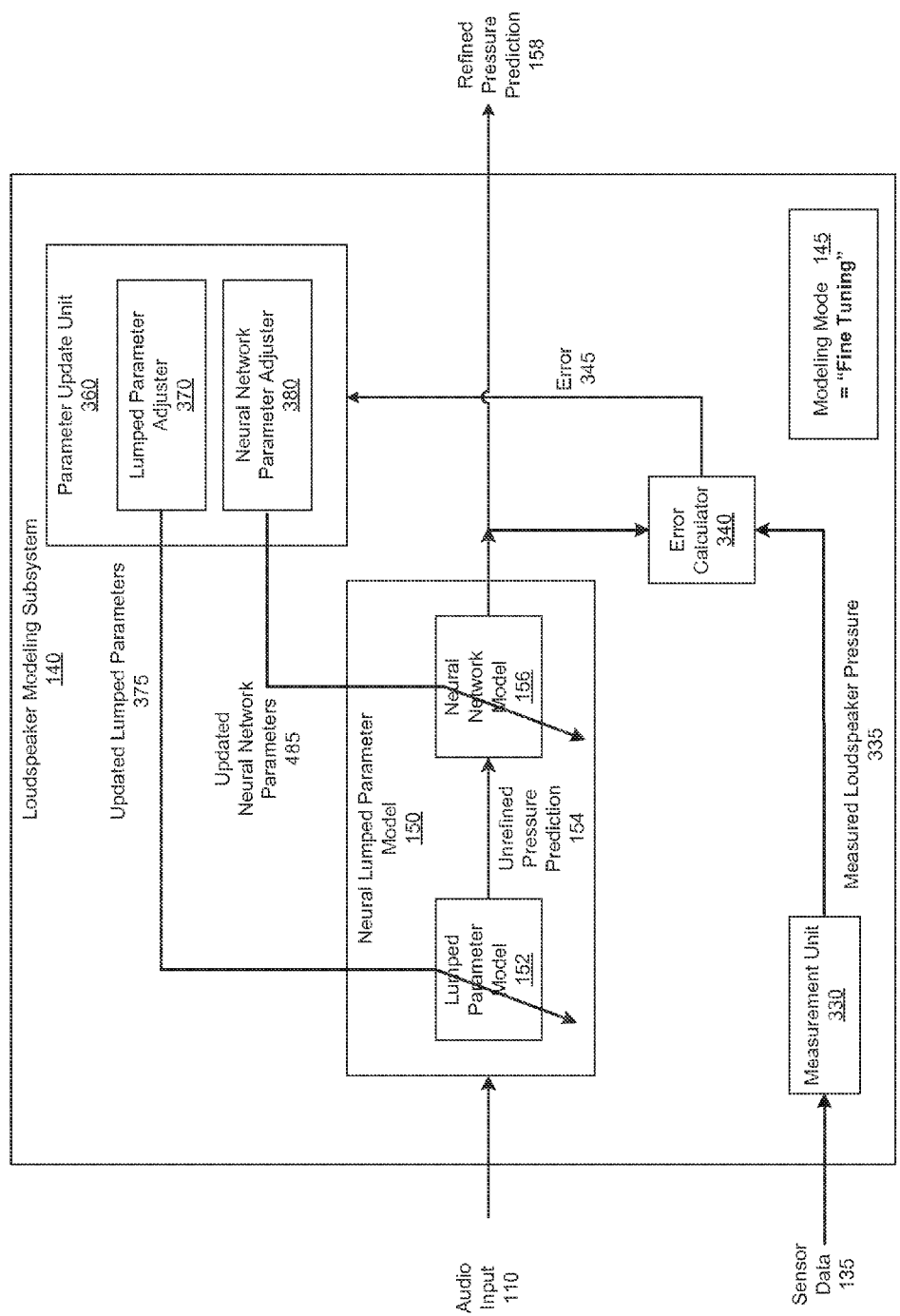
FIG. 5 is a more detailed illustration of the loudspeaker modeling subsystem of FIG. 1 showing how to fine tune the neural lumped parameter model, according to various embodiments.

FIG. 5 is a more detailed illustration of the loudspeaker modeling subsystem 140 of FIG. 1 showing how to fine tune the neural lumped parameter model 150, according to various embodiments. As shown, the loudspeaker modeling subsystem 140 includes, without limitation, the modeling mode 145, the neural lumped parameter (NeLP) model 150, the measurement unit 330, the error calculator 340, and the parameter update unit 360.

While characterizing the NeLP model 150, the value of the modeling mode 145 is "fine tuning parameters." In operation, as the NeLP 150 computes the refined pressure prediction 158, the measurement unit 330 processes the sensor data 135 that reflects the response of the loudspeaker 120 to the audio input 110, and generates the measured loudspeaker pressure 335. The error calculator 340 receives the refined pressure prediction 158 in addition to the measured loudspeaker pressure 335 and then generates the error 345, which is the difference between the refined pressure prediction 158 and the measured loudspeaker pressure 335.

The parameter update unit 360 receives the error 345 and, in response, the lumped parameter adjuster 370 generates updated lumped parameters 375 and the neural network parameter adjuster 380 generates updated neural network parameters 485. The loudspeaker modeling subsystem 140 then feeds back the updated lumped parameters 375 to the LPM 152 and the updated neural network parameters 485 to the NN model 156. Subsequently, the LPM 152 adopts the updated lumped parameters 375 and the NN model 156 adopts the updated neural network parameters 485. In alternate embodiments, any portion of the neural network parameter adjuster 380 and/or lumped parameter adjuster 370 may be integrated with the LPM 152 and the NN model 156 in any combination. In this fashion, the loudspeaker modeling subsystem 140 iteratively adjusts the values of the parameters of both the LPM 152 and the values of the parameters used in the NN model 156 (i.e., "trains" the NN model 156) to fine tune the error between the refined pressure prediction 156 and the measured loudspeaker pressure 335.

Figure 6:
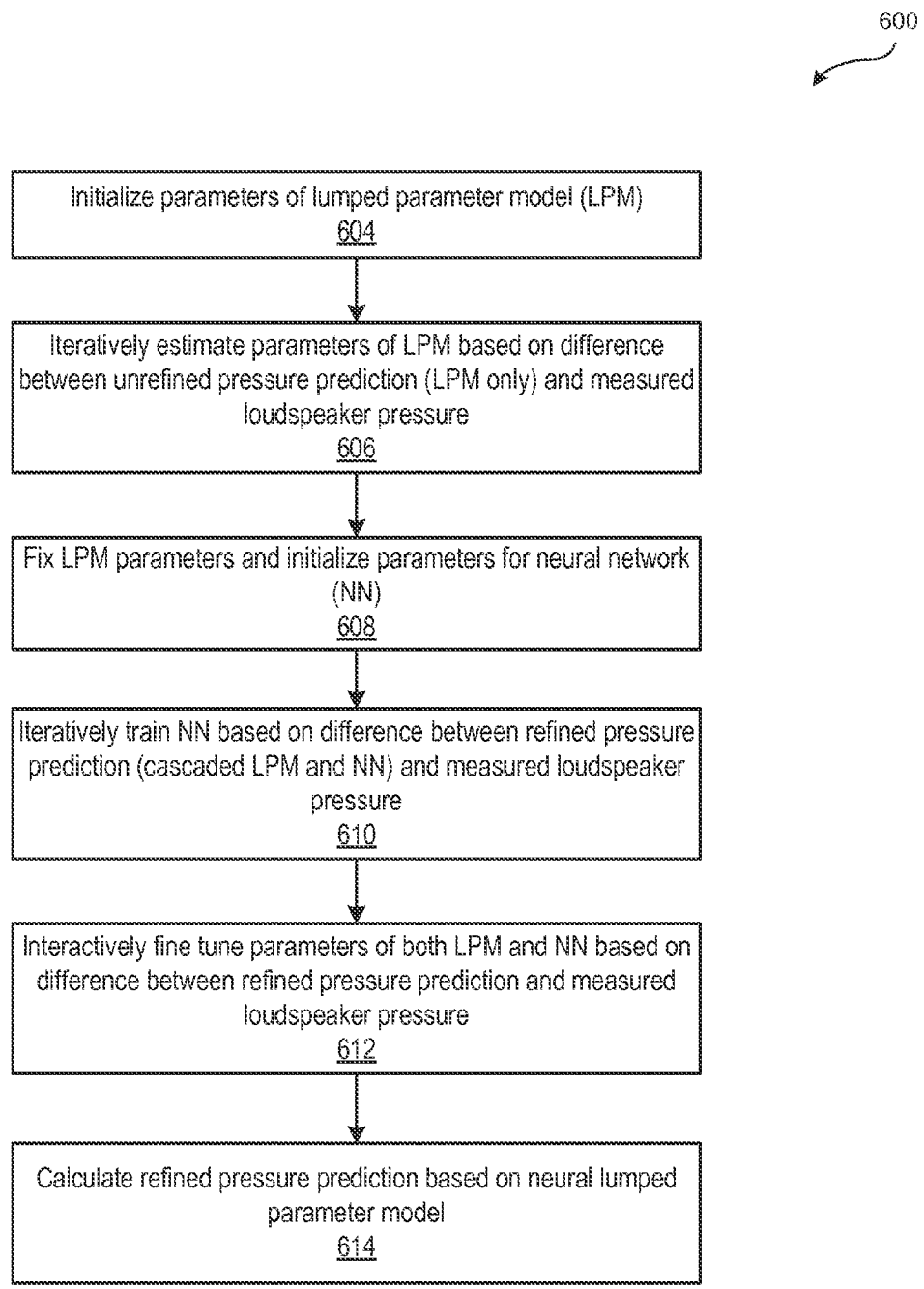
FIG. 6 is a flow diagram of method steps for generating a neural lumped parameter model of a loudspeaker, according to various embodiments.

FIG. 6 is a flow diagram of method steps for generating a neural lumped parameter model of a loudspeaker, according to various embodiments. Although the method steps are described in conjunction with the systems of FIGS. 1-5, persons skilled in the art will understand that any system configured to implement the method steps, in any order, falls within the scope of the present invention.

As shown, a method 600 begins at step 604, where the loudspeaker modeling subsystem 140 initialize the values of the parameters used in the lumped parameter model (LPM) 152. The loudspeaker modeling subsystem 140 may set the initial values of the parameters used in the LPM 152 in any fashion that reflects physically feasible behavior of the loudspeaker 120.

At step 606, the loudspeaker modeling subsystem 140 receives the audio input 110 and the sensor data 135 (reflecting aspects of the behavior of the loudspeaker 120). In response, the loudspeaker modeling subsystem 140 iteratively estimates values for the parameters used in the LPM 152 based on reducing the difference between the unrefined pressure prediction 154 generated by the LPM 152 and the measured loudspeaker pressure 335. Notably the loudspeaker modeling subsystem 140 may inactivate the NN model 156 included in the NeLP model 150 while the loudspeaker modeling subsystem 140 estimates values for the parameters used in the LPM 152.

At step 608, the loudspeaker modeling subsystem 140 fixes the values of the parameters used in the LPM 152 and initializes the values of the parameters used in the NN model 156. The loudspeaker modeling subsystem 140 may select the initial values of the parameters used in the NN model 156 in any technically feasible fashion that is consistent with the architecture of the NN model 156. At part of step 608, the loudspeaker modeling subsystem 140 routes the unrefined pressure prediction 154 generated by the LPM 152 to the NN model 156 and activates the NN model 156.

At step 610, the loudspeaker modeling subsystem 140 trains the NN model 156 to reduce errors in the unrefined pressure prediction 154, generating the refined pressure prediction 158. More specifically, as the NN model 156 generates the refined pressure prediction 158 in response to receiving the unrefined pressure prediction 154, the loudspeaker modeling subsystem 140 iteratively trains the NN model 156 to reduce the error 345 between refined pressure prediction 158 and measured loudspeaker pressure 335.

At step 612, the loudspeaker modeling subsystem 140 iteratively fine tunes values of the parameters used in the LPM 152 and values of the parameters used in the NN 158, substantially in parallel, to minimize the error 345 between the refined pressure prediction 158 and the measured loudspeaker pressure 335. At step 614, the NeLP model 150 (the combination of the LPM 152 followed by the NN model 156) receives the audio input 110 and generates the refined pressure prediction 158 corresponding to the audio input 110, thereby emulating the loudspeaker 120.

In sum, the disclosed techniques enable efficient and accurate simulation of loudspeakers using a neural lumped parameter (NeLP) loudspeaker model. The NeLP model is a cascaded combination of a lumped parameter (LP) model and a neural network model. To configure the NeLP model associated with a particular loudspeaker, a loudspeaker modeling subsystem first configures the LP model to emulate, without limitation, displacement, current, and pressure related nonlinearities of a loudspeaker. The loudspeaker modeling subsystem then configures the NN model portion of the NeLP model to adjust the predicted output pressure of the LP model to reflect the underlying causes of these nonlinearities that are not adequately represented by the LP model. Finally, the loudspeaker modeling subsystem fine-tunes both the LP model and the NN model in combination, iteratively reducing errors between the output pressure predicted by the NeLP model and a measured output pressure of the loudspeaker.

At least one advantage of the disclosed approaches is that they enable both efficient and accurate simulation of the nonlinear aspects of loudspeaker systems. More specifically, the NN model portion of the NeLP model "learns" only characteristics of loudspeakers that are not adequately represented by the LPM portion of the NeLP model. Further, the NN model portion of the NeLP model compensates for residual errors in values of the parameters used in the LP model. Consequently, the time required to simulate using the NeLP model is significantly less than the time required to simulate using conventional NN models, while the accuracy provided by the NeLP model is significantly higher than the accuracy provided by conventional LPMs. Notably, reducing the compromises inherent in conventional models of loudspeakers enables optimized loudspeaker design flows, such as iterative design processes.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The invention has been described above with reference to specific embodiments. Persons of ordinary skill in the art, however, will understand that various modifications and changes may be made thereto without departing from the broader spirit and scope of the invention as set forth in the appended claims. For example, and without limitation, although many of the descriptions herein refer to specific types of audiovisual equipment and sensors, persons skilled in the art will appreciate that the systems and techniques described herein are applicable to other types of performance output devices (e.g., lasers, fog machines, etc.) and sensors. The foregoing description and drawings are, accordingly, to be regarded in an illustrative rather than a restrictive sense.

While the preceding is directed to embodiments of the present disclosure, other and further embodiments of the disclosure may be devised without departing from the basic scope thereof, and the scope thereof is determined by the claims that follow.

What is claimed is:

1. A computer-implemented method, comprising:
generating, via a lumped parameter model of a loudspeaker executing on a processor, a first predicted output pressure based on a first audio input signal and a measured characteristic of the loudspeaker that corresponds to the first audio input signal; and
training a neural network model executing on the processor to generate a second predicted output pressure based on the first predicted output pressure and a measured output pressure of the loudspeaker that corresponds to the first audio input signal, wherein a first difference between the second predicted output pressure and the measured output pressure is less than a second difference between the first predicted output pressure and the measured output pressure,
wherein the second predicted output pressure is used to analyze or design the loudspeaker.

2. The method of claim 1, further comprising:
generating via the lumped parameter model a third predicted output pressure based on a second audio input signal;
generating via the neural network model a fourth predicted output pressure based on the third predicted output pressure; and
updating at least one of the lumped parameter model and the neural network model based on a fourth difference between the fourth predicted output pressure and a measured output pressure of the loudspeaker that corresponds to the second audio input signal.

3. The method of claim 1, wherein the measured characteristic is one of a voice coil current, a cone displacement, and an output pressure.

4. The method of claim 1, further comprising assigning a value to each of one or more parameters included in the lumped parameter model.

5. The method of claim 4, wherein assigning a first value to a first parameter included in the lumped parameter model comprises performing one or more parameter estimation operations based on an adaptive nonlinear least squares algorithm.

6. The method of claim 5, wherein the first parameter represents a voice coil inductance polynomial coefficient, a suspension stiffness polynomial coefficient, a force factor polynomial coefficient, a mechanical resistance, or a total moving mass.

7. The method of claim 1, wherein training the neural network model comprises assigning a value to each of one or more parameters included in the neural network model, and assigning a first value to a first parameter included in the neural network model comprises performing one or more iterative optimization operations to minimize a least squares error cost function.

8. The method of claim 1, further comprising, prior to training the neural network model, performing one or more feature extraction operations on the first predicted output pressure, wherein the or more feature extraction operations change the dimensionality of the first predicted output pressure.

9. The method of claim 1, wherein the neural network model includes at least one of a cascade correlation neural network, a recurrent cascade neural network, a recurrent neural network, and a MultiLayer Perceptron neural network.

10. The computer-implemented method of claim 1, further comprising:
updating values of one or more parameters in the lumped parameter model based on the second difference to iteratively optimize the lumped parameter model; and
updating values of one or more parameters in the neural network model based on the first difference to iteratively optimize the neural network model.

11. A non-transitory, computer-readable storage medium including instructions that, when executed by a processor, cause the processor to perform the steps of:
determining a measured characteristic of a first sound generated by the loudspeaker based on a first audio input signal;
generating, via a lumped parameter model of a loudspeaker executing on a processor, a first predicted output pressure based on the first audio input signal and the measured characteristic; and
training a neural network model executing on the processor to generate a second predicted output pressure based on the first predicted output pressure and a measured output pressure of the first sound, wherein a first difference between the second predicted output pressure and the measured output pressure is less than a second difference between the first predicted output pressure and the measured output pressure, wherein the second predicted output pressure is used to analyze or design the loudspeaker.

12. The non-transitory computer-readable storage medium of claim 11, further comprising:
  generating via the lumped parameter model a third predicted output pressure based on a second audio input signal;
  generating via the neural network model a fourth predicted output pressure based on the third predicted output pressure; and
  updating at least one of the lumped parameter model and the neural network model based on a fourth difference between the fourth predicted output pressure and a measured output pressure of the loudspeaker that corresponds to the second audio input signal.

13. The non-transitory computer-readable storage medium of claim 11, wherein the measured characteristic comprises one of a voice coil current, a cone displacement, or an output pressure.

14. The non-transitory computer-readable storage medium of claim 11, further comprising assigning a value to each of one or more parameters included in the lumped parameter model.

15. The non-transitory computer-readable storage medium of claim 11, wherein assigning a first value to a first parameter included in the lumped parameter model comprises performing one or more parameter estimation operations based on an adaptive nonlinear least squares algorithm.

16. The non-transitory computer-readable storage medium of claim 15, wherein the first parameter represents a voice coil inductance polynomial coefficient, a suspension stiffness polynomial coefficient, a force factor polynomial coefficient, a mechanical resistance, or a total moving mass.

17. The non-transitory computer-readable storage medium of claim 11, wherein training the neural network model comprises assigning a value to each of one or more parameters included in the neural network model, and assigning a first value to a first parameter included in the neural network model comprises performing one or more iterative optimization operations to minimize a least squares error cost function.

18. The non-transitory computer-readable storage medium of claim 11, wherein the loudspeaker comprises a direct radiating loudspeaker or a horn loudspeaker.

19. The non-transitory computer-readable storage medium of claim 11, further comprising, prior to training the neural network model, performing one or more feature extraction operations on the first predicted output pressure, wherein the or more feature extraction operations change the dimensionality of the first predicted output pressure.

20. A computing device, comprising:
  a memory that includes a neural lumped parameter model of a loudspeaker that includes a lumped parameter model of the loudspeaker and a neural network model; and
  a processor coupled to the memory and, upon executing the neural lumped parameter model, is configured to:
    generate, via the lumped parameter model executing on the processor, a first predicted output pressure based on a first audio input signal and a measured characteristic of the loudspeaker that corresponds to the first audio input signal; and
    train the neural network model executing on the processor to generate a second predicted output pressure based on the first predicted output pressure and a measured output pressure of the loudspeaker that corresponds to the first audio input signal, wherein a first difference between the second predicted output pressure and the measured output pressure is less than a second difference between the first predicted output pressure and the measured output pressure,
    wherein the second predicted output pressure is used to analyze or design the loudspeaker.

21. The computing device of claim 20, wherein the processor is further configured to:
  generate via the lumped parameter model a third predicted output pressure based on a second audio input signal;
  generate via the neural network model a fourth predicted output pressure based on the third predicted output pressure; and
  update at least one of the lumped parameter model and the neural network model based on a fourth difference between the fourth predicted output pressure and a measured output pressure of the loudspeaker that corresponds to the second audio input signal.

* * * * *